United States Patent
Polson et al.

(10) Patent No.: US 6,544,898 B2
(45) Date of Patent: Apr. 8, 2003

(54) METHOD FOR IMPROVED DIE RELEASE OF A SEMICONDUCTOR DEVICE FROM A WAFER

(75) Inventors: Bruce Polson, New Prague, MN (US); Nan Zhang, Eden Prairie, MN (US); Howard P. Wilson, Hudson, WI (US)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 09/891,105

(22) Filed: Jun. 25, 2001

(65) Prior Publication Data

US 2002/0197873 A1 Dec. 26, 2002

(51) Int. Cl.$^7$ ............................................. H01L 21/00
(52) U.S. Cl. .................... 438/719; 216/2; 216/79; 438/740; 438/739; 438/745; 438/756
(58) Field of Search ................ 216/2, 67, 79, 216/99; 438/24, 48, 712, 719, 723, 738, 740, 743, 745, 756, 739

(56) References Cited

U.S. PATENT DOCUMENTS

| | | | |
|---|---|---|---|
| 5,994,816 A | 11/1999 | Dhuler et al. | |
| 6,074,890 A | 6/2000 | Yao et al. | |
| 6,242,363 B1 * | 6/2001 | Zhang | 438/739 |
| 6,402,969 B1 * | 6/2002 | Rodgers et al. | 438/739 X |

* cited by examiner

Primary Examiner—William A. Powell
(74) Attorney, Agent, or Firm—Merchant & Gould P.C.

(57) ABSTRACT

A microelectromechanical (MEMS) device and a method of fabricating a MEMS device are provided. The method of fabricating the MEMS device includes the steps of: etching a die release trench in a primary handle layer of a wafer having the handle layer, an etch-stop layer disposed on the primary handle layer, and a device layer disposed on the etch-stop layer; patterning a release trench in the device layer that is aligned with the release trench in the primary handle layer; temporarily attaching an additional handle layer to the primary handle layer; etching the device layer to define a structure in the device layer; removing the etch-stop layer; and removing the additional handle layer to release the die.

19 Claims, 3 Drawing Sheets

METHOD FOR IMPROVED DIE RELEASE OF A SEMICONDUCTOR DEVICE FROM A WAFER

FIELD OF THE INVENTION

The present invention relates to a method of fabricating a semiconductor device on a wafer, and more particularly, to a method that provides a simplified die release technique of the semiconductor device from the wafer.

BACKGROUND OF THE INVENTION

Modern technology has enabled microelectromechanical systems (MEMS) to be fabricated on semiconductor substrates, typically silicon wafers. MEMS structures typically have sizes on the order of microns and may be integrated with electrical circuits on a common substrate. As a result, MEMS have found their way into numerous applications across numerous industries. Exemplary MEMS applications include optical switching, inertial or pressure sensors, and biomedical devices for example.

MEMS components are typically built at the wafer level and must be freed from the wafer after the fabrication process, which is referred to as "die release." The term "die" is typically defined as the piece of wafer containing the semiconductor or MEMS structure. Typically a wafer will have tens to hundreds of die located thereon. Currently, products, such as MEMS-based fiber optic switches, are processed at the wafer level using a composite structure known as an SOI wafer that is generally formed by three layers of materials. The top layer is silicon (Si) and ultimately forms the MEMS device, and is often referred to as a device layer. The middle layer is an oxide and is used as an etch-stop layer. The bottom layer is also silicon (Si) and is used as a handle or support and is often referred to as a handle layer.

The SOI wafer is processed using conventional semiconductor processing techniques to create the device. Generally, semiconductor fabrication processing steps are performed from the top side of the wafer down into the wafer, i.e., at the device layer level. To define individual die on the wafer, trenches are formed in the device layer of the wafer.

Once processing is complete, the trenches between die must completely extend through the etch-stop and handle layer to separate the wafer into individual die. Dicing or sawing is often performed to accomplish this die releasing operation. However, problems with dicing or sawing include debris generation, rough edge creation, and yield loss due to process conditions, such as vibrations, etc. Furthermore, dicing may not be cost effective in comparison to an etching solution depending on the number of cuts per wafer.

Therefore, it is desirable to have an improved techniques for both releasing the structures on the die itself, and releasing the die from the wafer, or using a single technique to simultaneously accomplish both release operations.

SUMMARY OF THE INVENTION

In accordance with this invention, the above and other problems were solved by creating a die release trench in a handle layer as one of the initial steps.

According to a first aspect of the invention, there is provided a method of fabricating a semiconductor die on a wafer having a device layer, an etch-stop layer, and a primary handle layer, wherein the etch-stop layer is sandwiched between the device layer and the primary handle layer. The method includes the steps of:

(a) etching a die release trench in the primary handle layer;

(b) etching a moving parts trench and die release trench in the device layer where the die trench in the device layer is aligned with the die release trench formed in the primary handle layer;

(c) affixing an additional handle layer to the primary handle layer;

(d) removing the etch-stop layer located between the die release trenches on the device and primary handle layers; and (e) removing the additional handle layer to release the die.

According to a second aspect of the present invention there is provided a method of fabricating a semiconductor die on a wafer having a device layer, an etch-stop layer, and a primary handle layer, wherein the etch-stop layer is sandwiched between the device layer and the primary handle layer. The method includes the steps of:

(a) creating a die release trench in the primary handle layer;

(b) creating a die release trench in the device layer where the die trench in the device layer is aligned with the die release trench formed in the primary handle layer;

(c) affixing an additional handle layer to the primary handle layer;

(d) removing the etch-stop layer located between the die release trenches on the device and primary handle layers; and (e) removing the additional handle layer to release the die.

According to a third aspect of the invention, there is provided a MEMS device formed in a wafer having a device layer, an etch-stop layer and a primary handle layer wherein the etch-stop layer is sandwiched between the device layer and the primary handle layer by the above-described processes.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENTS OF THE PRESENT INVENTION

Figure 1:
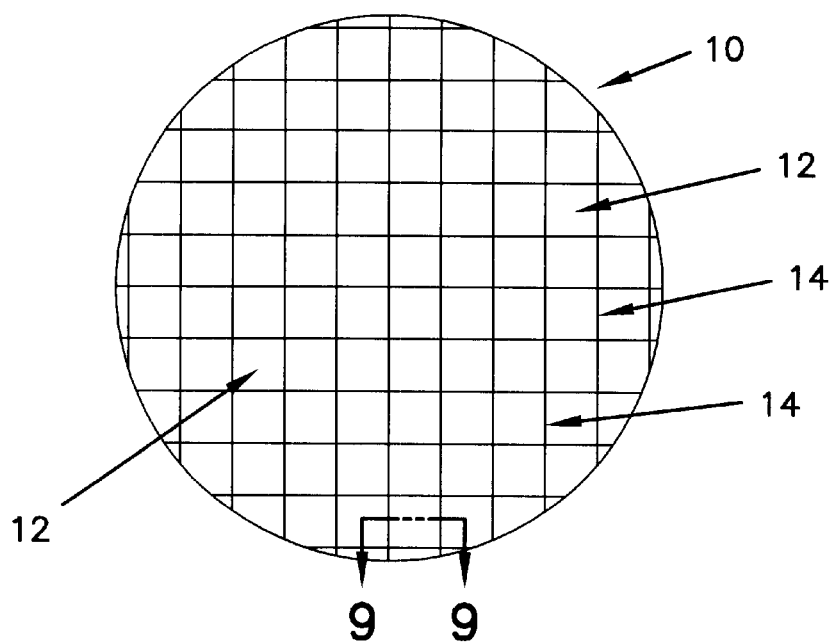
FIG. 1 is a top plan view of a wafer having multiple die defined thereon.

The present invention provides an improved semiconductor fabrication technique. While the preferred embodiments of the present invention will be described with reference to fabricating a microelectromechanical (MEMS) device, the process can be used to fabricate other semiconductor structures, and the present invention is not limited to the particular structure illustrated in the drawings.

FIG. 1 is a top view of a wafer 10 having multiple die 12 defined thereon. As is common in the industry, the wafer 10 is round, but the wafer may have other shapes such as square or rectangular. Trenches 14 are formed in the wafer 10 to define the individual die 12. As described in the background, prior art fabrication techniques diced or sawed the wafer along the trenches 14 to release the individual dies 12 from the wafer 10. The fabrication process according to a preferred embodiment of the present invention eliminates the dicing or sawing step from the process of releasing the individual dies from the wafer as will be explained in detail hereinafter.

Figure 2:
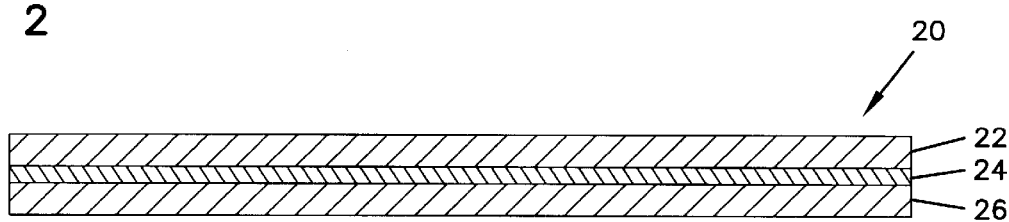
FIG. 2 is a cross-sectional view of a portion of an SOI wafer before processing has commenced.
Figure 3:
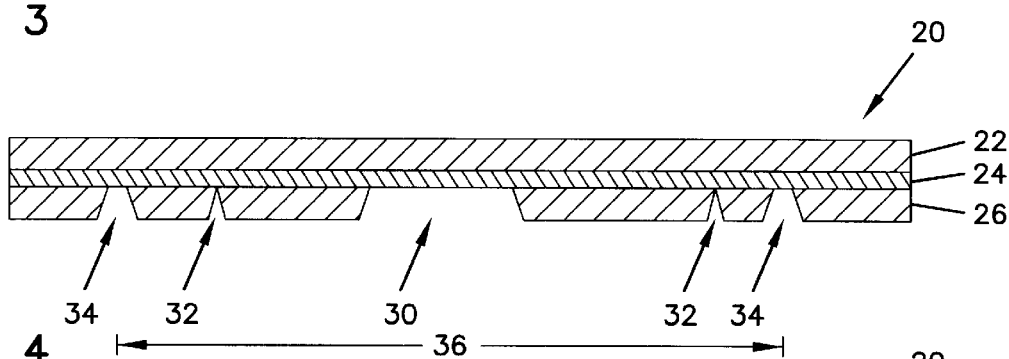
FIGS. 3–10 are cross-sectional views of the SOI wafer during various processing steps according to a preferred embodiment of the present invention.
Figure 4:
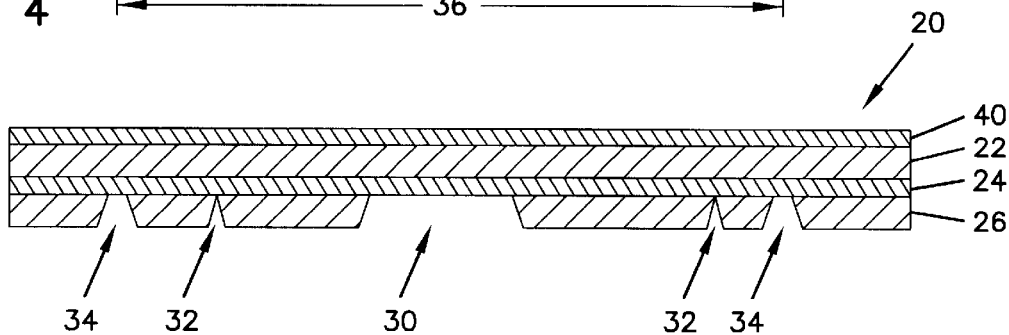
Figure 5:
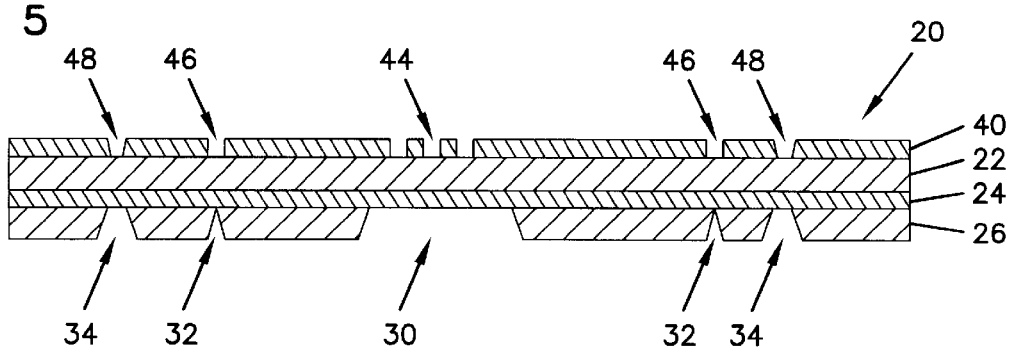

FIG. 2 is a cross-sectional view of a portion of an SOI wafer before processing has commenced. The SOI wafer 20 includes a top, device layer 22, a middle, etch-stop layer 24, and a bottom, primary handle layer 26. The device layer 22 is preferably made of silicon, the etch-stop layer 24 is preferably made of silicon oxide, and the primary handle layer 26 is preferably made of silicon. It will be appreciated that wafers formed of other materials may be used within the scope of the present invention.

FIGS. 3–10 are cross-sectional views of the SOI wafer during various processing steps according to a preferred embodiment of the present invention. Unlike prior art fabrication techniques, the wafer according to a preferred embodiment of the present invention is processed from both the top and bottom layers of the wafer. The first processing step is performed in the bottom primary handle layer 26. Several structures are formed in the bottom primary handle layer 26 of the wafer 20 using well known patterning and etching techniques. A stiction relief trench 30, which will be described in detail hereinafter, is created in the center of the portion of the wafer shown. Vacuum holes 32 are formed on each side of the stiction relief trench 30 and die release trenches 34 are formed adjacent to the vacuum holes 32. The portion 36 of the wafer 20 between the die release trenches 34 after all processing steps are complete will be the die. While FIGS. 2–10 are cross-sectional views, it will be appreciated that in a three-dimensional to define each die there will be additional die release trenches created. There may also be additional vacuum holes 32. The stiction relief trench 30, vacuum holes 32 and die release trenches 34 all extend to the etch-stop layer 24.

The moving portions of a MEMS device which will be described hereinafter are positioned over the stiction relief trench 30. Eliminating this portion of the wafer substantially reduces and may eliminate static friction or stiction that can cause the moving parts of a MEMS device to get stuck.

Next, a resist layer 40 is spun on the device layer 22 by well-known semiconductor fabrication techniques. A pattern (not shown) is placed over the resist layer 40 and resist layer 40 is then exposed and developed to define areas that will be etched later in the process as will be described with reference to FIG. 7. Several trenches are defined in the resist layer 40. The trenches include trenches 44 that define the moving structure of the MEMS device, trenches 46 for the fixed portion of the MEMS device and die release trenches 48. The die release trenches 48 in the resist layer 40 are aligned over the die release trenches 34 in the bottom primary handle layer 26 using front to back mask alignment techniques prior to exposure of the resist pattern 40.

Figure 6:
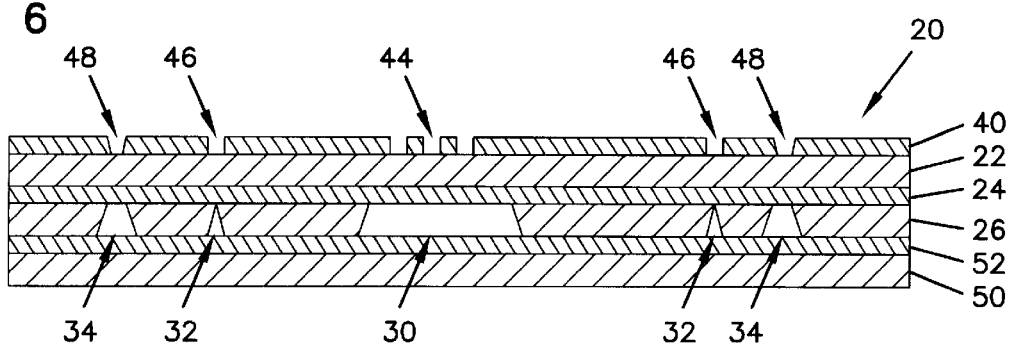

Next, as shown in FIG. 6, an additional handle layer 50, is attached to the primary handle layer 26 using a material such as a thermal release layer 52, e.g., Revalpha, which is commercially available.

Figure 7:
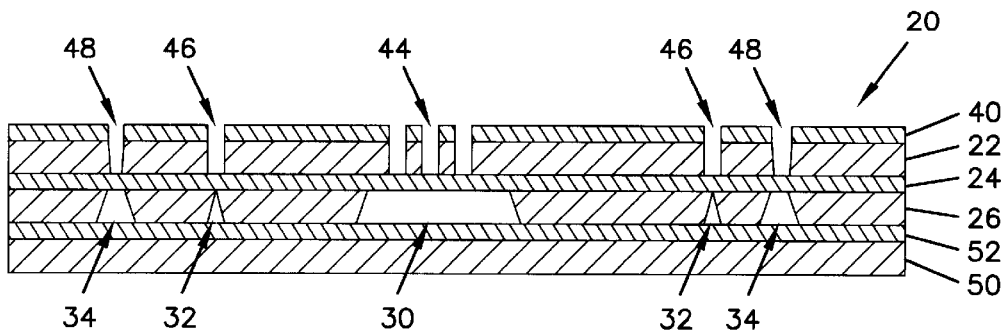
Figure 8:
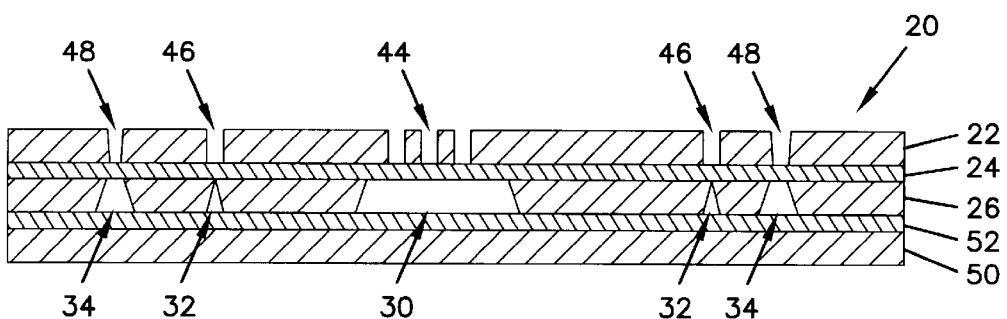

The wafer 20 is then etched from the top device layer side preferably using a deep reactive ion etch (DRIE). As shown in FIG. 7, the device layer 22 is etched away at the trench locations 44, 46, 48 to the etch-stop layer 24. The resist layer 40 is then removed as shown in FIG. 8.

Figure 9:
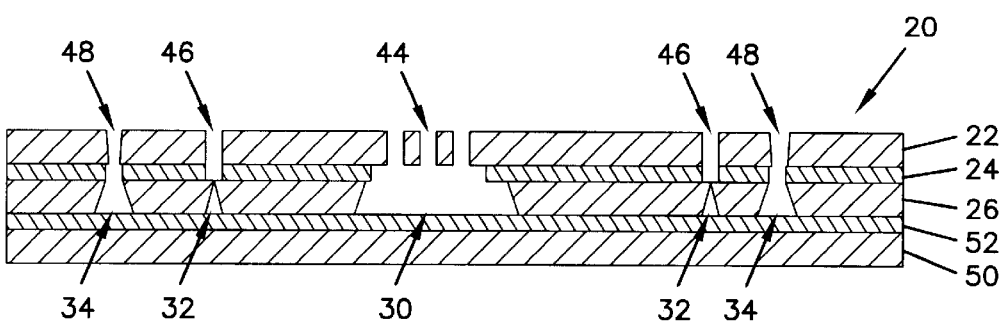

The etch-stop layer 24 resists the etching from the DRIE such that the etch-stop layer 24 remains intact. The wafer 20 is then exposed to hydrofluoric acid such that the etch-stop layer located between trenches in the device layer 22 and bottom primary handle layer 26 is removed as seen in FIG. 9. FIG. 9 is a cross-sectional view of a portion of the wafer shown in FIG. 1 taken along line 9—9.

Figure 10:
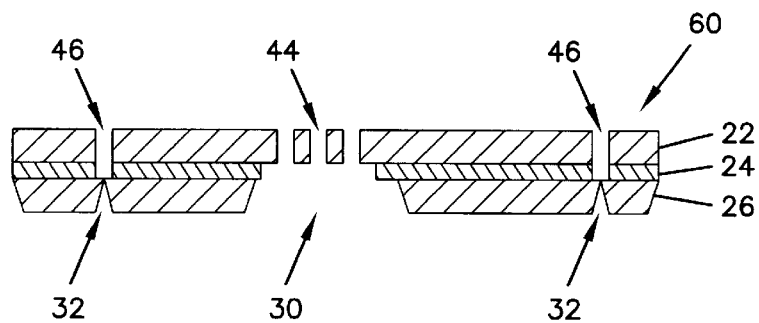

Finally, die release is achieved through a thermal process such that the additional handle layer 50 is removed from the primary handle layer 26. More particularly, the wafer 20 is placed in an oven where it is heated to activate the thermal release material which causes the additional handle layer to separate from the primary handle layer. When the additional handle layer 50 is removed and because the die release trenches in the device layer 22 and bottom primary handle layer 26 extend through where the etch-stop layer 24 used to be, the die 60 is released from the remaining portions of the wafer 20 as shown in FIG. 10. The additional handle layer 50 can be reused on other wafers.

The vacuum holes 32 formed in the bottom primary handle layer 26 have utility in that they can be used to facilitate subsequent mechanical assembly of the MEMS device. For example, if the vacuum holes 32 are located in grooves of the MEMS device that will house the optical fibers, a vacuum source can be applied to the vacuum holes to help hold the fibers in their respective grooves during alignment and gluing operations. In addition, the vacuum holes can be used to remove debris from the MEMS device during subsequent assembly.

It is appreciated that the terms "top side" and "bottom side" are relative and are used for the purposes of explanation, not limitation.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of fabricating a semiconductor die on a wafer having a device layer, an etch-stop layer, and a primary handle layer, wherein the etch-stop layer is sandwiched between the device layer and the primary handle layer, the method comprising the steps of:
   (a) etching a die release trench in the primary handle layer;
   (b) etching a moving parts trench and die release trench in the device layer where the die trench in the device layer is aligned with the die release trench formed in the primary handle layer;
   (c) affixing an additional handle layer to the primary handle layer;
   (d) removing the etch-stop layer located between the die release trenches on the device and primary handle layers; and
   (e) removing the additional handle layer to release the die.

2. The method of claim 1 wherein step (a) further comprises a step of etching a vacuum hole in the primary handle layer.

3. The method of claim 1 wherein step (c) further comprises applying a thermal release material to a surface of the additional handle layer that will come into contact with the primary handle layer.

4. The method of claim 3 wherein step (e) comprises heating the wafer.

5. The method of claim 1 wherein step (d) comprises exposing the wafer to hydrofluoric acid.

6. The method of claim 1 wherein step (a) further comprises a step of etching a stiction relief trench directly underneath the moving parts trench.

7. The method of claim 1, wherein step (b) comprises performing Deep Reactive Ion Etching (DRIE).

8. The method of claim 1 wherein step (a) is performed before step (b).

9. The method of claim 1 wherein step (c) is performed before step (d).

10. A MEMS device formed in a wafer having a device layer, an etch-stop layer and a primary handle layer wherein the etch-stop layer is sandwiched between the device layer and the primary handle layer by the process of claim 1.

11. The MEMS device of claim 10 wherein the device layer and primary handle layer are silicon.

12. A method of fabricating a semiconductor die on a wafer having a device layer, an etch-stop layer, and a primary handle layer, wherein the etch-stop layer is sandwiched between the device layer and the primary handle layer, the method comprising the steps of:

(a) creating a die release trench in the primary handle layer;

(b) creating a die release trench in the device layer where the die trench in the device layer is aligned with the die release trench formed in the primary handle layer;

(c) affixing an additional handle layer to the primary handle layer;

(d) removing the etch-stop layer located between the die release trenches on the device and primary handle layers; and (e) removing the additional handle layer to release the die.

13. The method of claim 12 wherein step (a) further comprises a step of etching a vacuum hole in the primary handle layer and step (b) further comprises a step of creating a moving parts trench in the device layer.

14. The method of claim 12 wherein step (c) further comprises applying a thermal release material to a surface of the additional handle layer that will come into contact with the primary handle layer.

15. The method of claim 12 wherein step (e) comprises heating the wafer.

16. The method of claim 12 wherein step (d) comprises exposing the wafer to hydrofluoric acid.

17. The method of claim 12 wherein step (a) further comprises a step of creating a stiction relief trench directly underneath the moving parts trench.

18. A MEMS device formed in a wafer having a device layer, an etch-stop layer and a primary handle layer wherein the etch-stop layer is sandwiched between the device layer and the primary handle layer by the process of claim 12.

19. The MEMS device of claim 18 wherein the device layer and primary handle layer are silicon.

* * * * *